United States Patent
Gault et al.

(10) Patent No.: US 10,025,352 B1
(45) Date of Patent: Jul. 17, 2018

(54) LOCKING MECHANISMS IN HYBRID ELECTRONIC DEVICES

(71) Applicant: Microsoft Technology Licensing, LLC, Redmond, WA (US)

(72) Inventors: Joseph Benjamin Gault, West Linn, OR (US); Edward Giaimo, Bellevue, WA (US); Harold Franklin Talbot-Mantooth, Vancouver, WA (US); Scott Douglas Bowers, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/462,571

(22) Filed: Mar. 17, 2017

(51) Int. Cl.
*G06F 1/16* (2006.01)
*H05K 5/00* (2006.01)
*H05K 7/00* (2006.01)
*H05K 5/02* (2006.01)

(52) U.S. Cl.
CPC .......... *G06F 1/1632* (2013.01); *G06F 1/1616* (2013.01); *G06F 1/1626* (2013.01); *H05K 5/0221* (2013.01)

(58) Field of Classification Search
CPC ... H05K 5/0221; G06F 1/1616; G06F 1/1632; G06F 1/1626
USPC .............. 361/679.21–679.3, 679.55, 679.56; 455/575.1–575.9
See application file for complete search history.

(56) References Cited

U.S. PATENT DOCUMENTS

| | | | |
|---|---|---|---|
| 6,317,315 B1 | 11/2001 | Lee et al. | |
| 6,331,934 B1 | 12/2001 | Helot et al. | |
| 6,563,699 B1 | 5/2003 | Choi | |
| 6,781,819 B2 | 8/2004 | Yang et al. | |
| 6,788,527 B2 | 9/2004 | Doczy et al. | |
| 7,206,196 B2 | 4/2007 | Ghosh et al. | |
| 7,251,127 B2 | 7/2007 | Ghosh et al. | |
| 7,302,816 B1 | 12/2007 | Lu | |
| 7,489,502 B2 | 2/2009 | Hong et al. | |

(Continued)

FOREIGN PATENT DOCUMENTS

CN   201063125 Y   5/2008

OTHER PUBLICATIONS

"Panasonic Vehicle Dock for Toughbook Cf-20 Notebook", http://business.panasonic.co.uk/computer%20product/sites/default/nfsfiles/specsheet_uploads/CF-20_Notebook%20Dock_Spec_Sheet_(EN)%20V6.pdf, Retrieved on: Nov. 15, 2016, 2 pages.

*Primary Examiner* — Anthony Haughton
(74) *Attorney, Agent, or Firm* — Lempia Summerfield Katz LLC

(57) ABSTRACT

Devices, systems, and methods for locking a hybrid electronic device are described herein. An electronic device may include a housing, a first lock component attached to the housing or positioned in an opening of the housing, and a second lock component attached to the housing or positioned in an opening of the housing. The electronic device may be configured to connect with a locking device at the first lock component. The electronic device may also be configured to connect with an additional electronic device at the second lock component to provide a hybrid electronic device. Additionally, when the locking device is connected at the first lock component, the electronic device is configured to prevent the additional electronic device from being detached at the second lock component.

11 Claims, 5 Drawing Sheets

(56) References Cited

U.S. PATENT DOCUMENTS

| | | | |
|---|---|---|---|
| 7,505,265 B2 * | 3/2009 | Nishiyama | G06F 1/1632 361/679.43 |
| 7,652,873 B2 | 1/2010 | Lee | |
| 8,854,812 B2 | 10/2014 | Fan | |
| 9,423,833 B2 | 8/2016 | Sano et al. | |
| 2001/0001083 A1 | 5/2001 | Helot | |
| 2007/0177347 A1 * | 8/2007 | Nishiyama | G06F 1/1632 361/679.41 |
| 2012/0132661 A1 | 5/2012 | Gu et al. | |
| 2015/0036273 A1 | 2/2015 | Hui et al. | |
| 2015/0160700 A1 | 6/2015 | Yang et al. | |
| 2015/0268699 A1 | 9/2015 | Bathiche et al. | |
| 2016/0041589 A1 | 2/2016 | Tazbaz | |
| 2016/0090757 A1 * | 3/2016 | Aisaka | E05B 65/0067 70/58 |

* cited by examiner

LOCKING MECHANISMS IN HYBRID ELECTRONIC DEVICES

BACKGROUND

Use of computing devices is becoming more ubiquitous by the day. Computing devices range from standard desktop computers to wearable computing technology and beyond. One area of computing devices that has grown in recent years is hybrid electronic devices. In certain examples, hybrid electronic devices may act as a tablet computer or a laptop computer. Many hybrid electronic devices include input devices that may be separated from a screen or display device.

Current hybrid electronic devices do not include an anti-theft option for at least one component of the hybrid electronic device. For example, a lock may be attached to the input device (e.g., keyboard or track pad) of the hybrid electronic device, but the connected tablet or display remains unsecured. Even though the input device is securely locked, a potential thief may simply detach the tablet device from the input device and steal the tablet.

SUMMARY

Locking mechanisms between two devices or components of a hybrid electronic device are described herein. In one or more embodiments, an electronic device includes a housing, a first lock component attached to the housing or positioned in an opening of the housing, and a second lock component attached to the housing or positioned in an opening of the housing. The electronic device is configured to connect with a locking device at the first lock component. The electronic device is also configured to connect with an additional electronic device at the second lock component. Further, when the locking device is connected at the first lock component, the electronic device is configured to prevent the additional electronic device from being detached at the second lock component.

In another embodiment, a hybrid electronic device includes a first electronic device having a housing and a lock component attached to the housing or positioned in an opening of the housing. The hybrid electronic device also includes a second electronic device that is detachable from the first electronic device. The first electronic device is configured to connect with a locking device at the lock component, and wherein, when the locking device is connected to the lock component, the hybrid electronic device is configured to prevent the first electronic device and the second electronic device from being detached from each other.

In another embodiment, a hybrid electronic device includes a first electronic device having a lock component; a second electronic device that is detachable from the first electronic device; at least one processor; and at least one memory including computer program code for one or more programs; the at least one memory and the computer program code configured to, with the at least one processor, cause the hybrid electronic device to at least perform: (1) identify a connection between the first electronic device and the second electronic device; (2) identify a locking device attached at the lock component of the first electronic device; and (3) prevent the second electronic device from being detached from the first electronic device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DESCRIPTION OF THE DRAWING FIGURES

For a more complete understanding of the disclosure, reference is made to the following detailed description and accompanying drawing figures, in which like reference numerals may be used to identify like elements in the figures.

Figure 1:
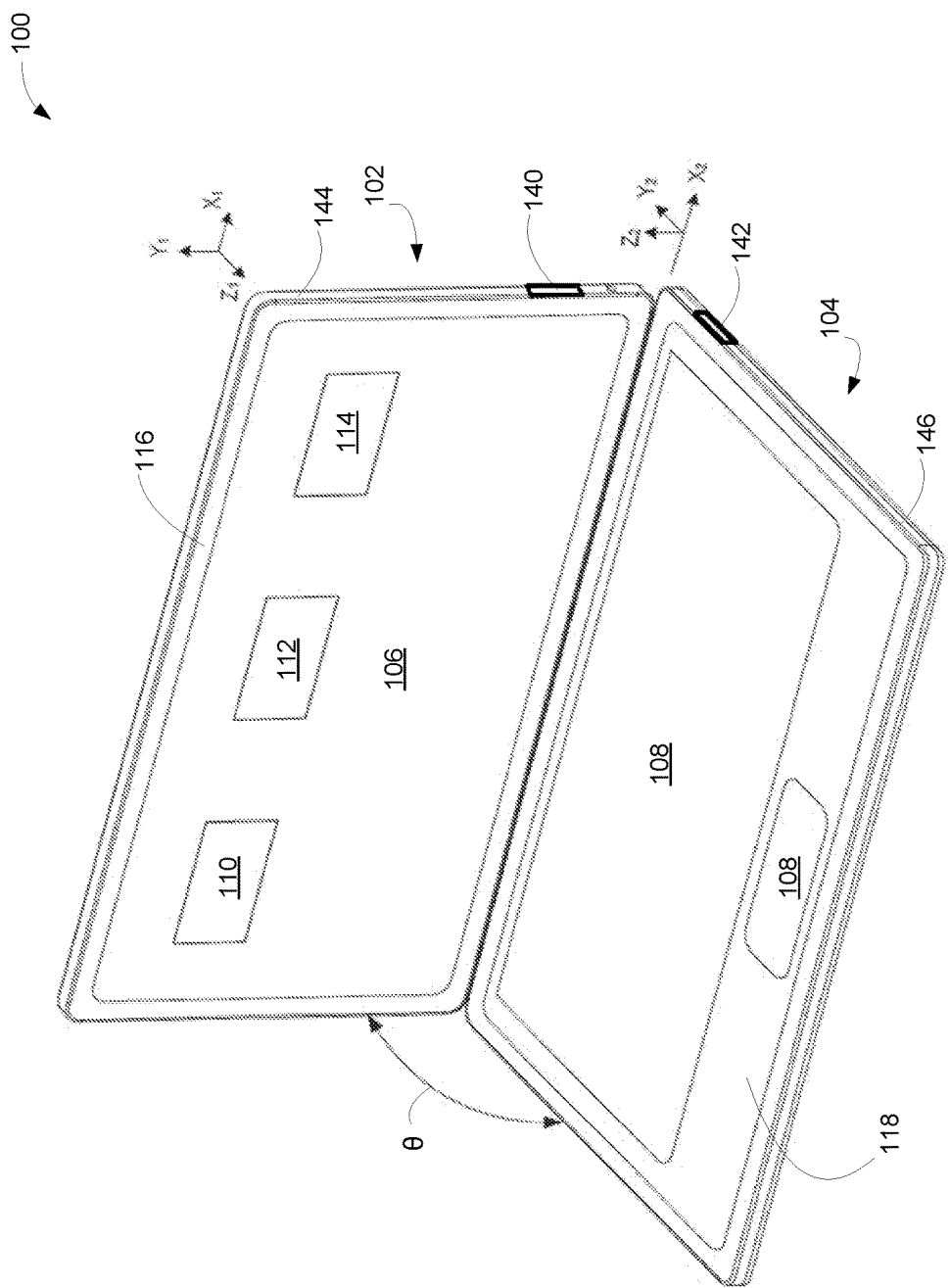
FIG. 1 depicts an example of a hybrid computing device.

While the disclosed devices and systems are representative of embodiments in various forms, specific embodiments are illustrated in the drawings (and are hereafter described), with the understanding that the disclosure is intended to be illustrative, and is not intended to limit the claim scope to the specific embodiments described and illustrated herein.

DETAILED DESCRIPTION

As used herein, a "hybrid electronic device," "hybrid computing device," or "hybrid device" may refer to a device having two or more individual components or devices that may be physically connected and disconnected from each other.

Devices, systems, and methods for securing each device of the hybrid electronic device using a locking mechanism are disclosed herein. Such locking mechanisms have several potential end-uses or applications, including being able to secure separable devices of a hybrid electronic device with a single lock (e.g., a Kensington lock or similar lock device). This is advantageous as an end-user only has to connect one component of the hybrid electronic device to a single external lock. This avoids multiple tethers or cables running to each component of the hybrid electronic device. This single lock connection may provide certain aesthetic advantages as well.

The locking mechanism may be incorporated into any hybrid electronic device having two or more connectable components or devices. Non-limiting examples of the components of a hybrid electronic device include a tablet or other handheld computing device, a laptop or mobile computer, a communication device such as mobile phone, an input device such as a keyboard or track pad, or an audio or video media player.

Various non-limiting examples of hybrid electronic devices and components of the hybrid electronic devices are described in greater detail below.

Figure 2:
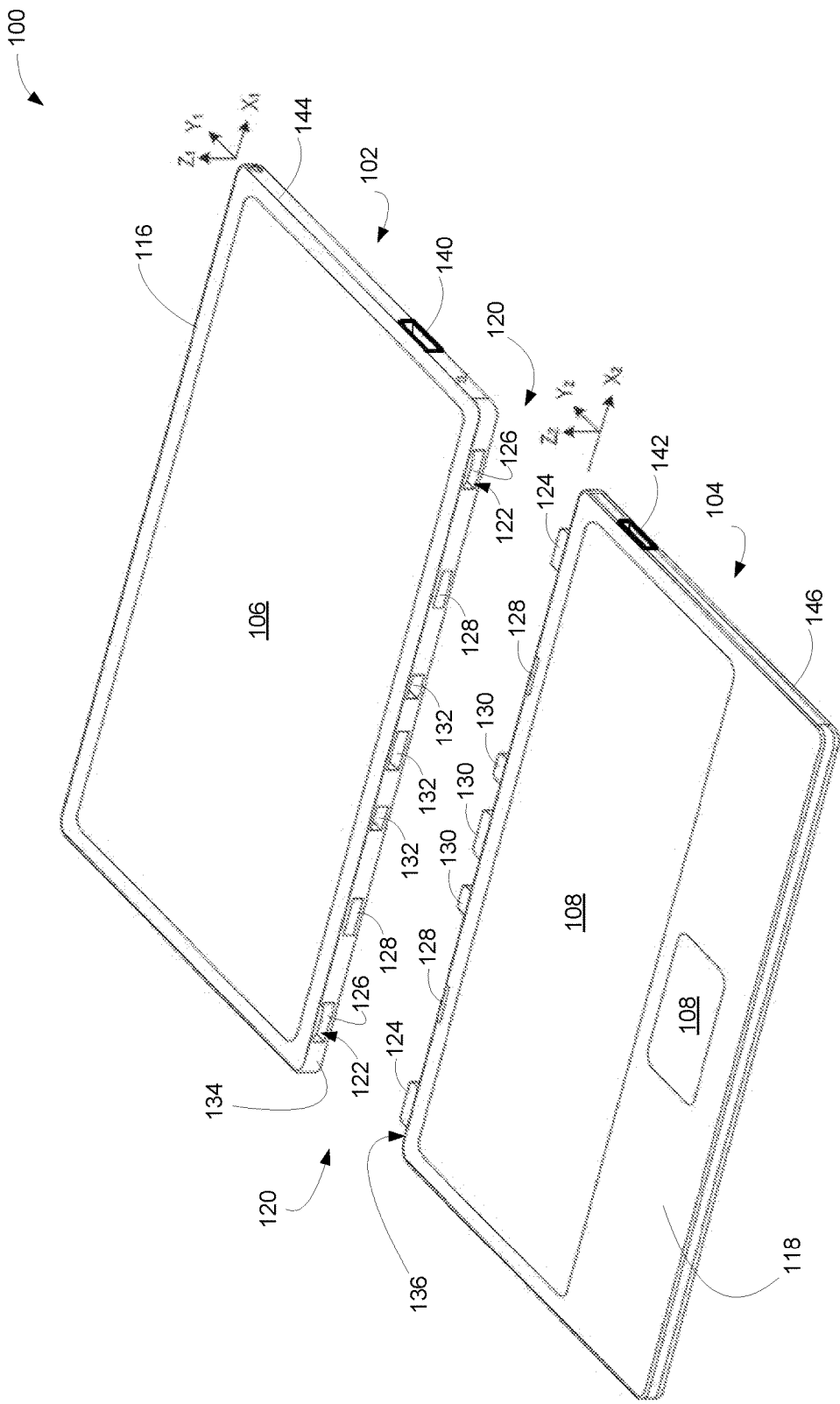
FIG. 2 depicts an example of separated components of the hybrid computing device of FIG. 1.

FIGS. 1 and 2 depict an example of a hybrid computing device 100 having a first component or electronic device 102 and a second component or electronic device 104. The first component 102 may be separably connected to the second component 104. FIG. 1 depicts the two components 102, 104 connected and FIG. 2 depicts the two components 102, 104 separated from each other.

By way of orientation, a first coordinate system 1-1 (including the $x_1$-direction, the $y_1$-direction, and the $z_1$-direction) is provided for the first component 102 and a second coordinate system 1-2 (including the $x_2$-direction, the $y_2$-direction, and the $z_2$-direction) is provided for the second component 104. In the illustrated configuration, these coordinate systems 1-1, 1-2 are rotated about their respective x-axes. When the angle (θ) between the first component 102 and the second component 104 is one-hundred and eighty degrees, the $x_1$ and $x_2$ axes are parallel, the $y_1$ and the $y_2$ axes, and the $z_1$ and the $z_2$ axes are parallel. When the angle (θ) between the first component 102 and the second component 104 is ninety degrees, the $x_1$ and $x_2$ axes are parallel, the $y_1$ and the $z_2$ axes are parallel, and the $z_1$ and the $y_2$ axes are parallel (but opposite, e.g., positive values extending in opposite directions). For ease of description, front is the positive z-direction, back is the negative z-direction, top is the positive y-direction, bottom is the negative y-direction, right is the positive x-direction, and left is the negative x-direction.

The first component 102 may include a display 106. The display 106 may include a touch sensitive display screen. The second component 104 may include an input device 108 such as a keyboard, touchpad, one or more buttons, other input devices, or a combination thereof.

The first component 102 and/or the second component 104 may include a processor 110, memory 112, a battery 114, other computing components, or combinations thereof. For example, as depicted in FIG. 1, the first component 102 includes a processor 110, memory 112, and a battery 114 positioned within a housing 116 of the first component 102. The second component 104 may also include a processor positioned within a housing 118 of the second component 104.

In some examples, only one of the first component 102 or the second component 104 may include a processor. In alternative examples, each of the first component 102 and the second component 104 includes a processor. In further examples, one or more computing components (e.g., processors, memory, and battery) may be included in the first component 102 and/or the second component 104 in any combination. In some examples, the input device 108 of the second component 104 may be used to provide input to the processor 110 of the first component 102.

Although a hybrid computing device having a display 106 and an input device 108 is depicted, the present disclosure may be used with other computing devices where two components or electronic devices are separably connected. For example, the first component 102 may be a mobile phone and the second component 104 may be a cover, a keyboard, or other device. In other examples, the locking mechanisms described herein may be used in a non-computing (e.g., purely mechanical) environment.

Although FIG. 1 and FIG. 2 illustrate the display 106 of the first component 102 and the input device 108 of the second component 104 as facing each other (e.g., both being on the front side of their respective components), in certain examples, the first component 102 and second component 104 may be reversible. For example, the first component 102 may connect to the second component 104 as shown (e.g., with the display 106 facing the front) and may be undocked, rotated 180 degrees, and docked to the second component 104 such that the first component 102 faces the opposite direction (e.g., with the display 106 facing the back). Thus, the locking mechanism 120 may be configured to allow a reversible connection between the first component 102 and the second component 104.

The first component 102 may be separably connected to the second component 104 by a locking mechanism 120. For example, the first component 102 may be mechanically connected to the second component 104 in a docked (and/or locked) configuration, such as the docked configuration shown in FIG. 1. The first component 102 may transition from the docked configuration to an undocked configuration, such as the undocked configuration shown in FIG. 2. The first component 102 and the second component 104 may transition from the docked to the undocked configuration and from the undocked to the docked configuration.

The locking mechanism 120 may include lock components (e.g., locking protrusions or receptacles) on the first and second electronic devices 102, 104. The lock components on the two devices are configured to interact with each other to define the locking mechanism 120. For example, as depicted in FIG. 2, the first electronic device 102 may include one or more receptacles 122 on a surface 134 of the housing 116 of the first electronic device 102. The second electronic device 104 may include one or more protrusions 124 positioned on a surface 136 of the housing 118 of the second electronic device 104.

Each receptacle 122 may include an opening, slot, or aperture 126 through which a respective protrusion 124 may be inserted. In some examples, the locking mechanism may include one or more magnets 128 positioned on each of the first electronic device 102 and second electronic device 104, wherein a magnet on the first electronic device 122 is configured to interact with a magnet on the second electronic device 124 to secure the two devices or components together.

The computing components of the second electronic device 104 may be in electronic communication with one or more of the computing components of the first electronic device 102. For example, as depicted in FIG. 2, the first electronic device 102 and the second electronic device 104 may be in electronic communication via a physical electrical connector that includes an electrical protrusion 130 and an electrical receptacle 132.

As depicted in FIG. 2, one or more electrical protrusions 130 are located on the housing 118 of the second component 104 and one or more electrical receptacles 132 are located within at least one opening of the housing 116 of the first component 102. In other examples, one or more electrical receptacles are located on the housing of the second component 104 and one or more electrical protrusions are located within at least one opening of the housing of the first component 102. In further examples, the first component 102 and the second component 104 may include one or more electrical receptacles and one or more electrical protrusions, such that each of the first component 102 and second component 104 may include a combination of electrical receptacles and electrical protrusions.

The electrical protrusions 130 and/or electrical receptacles 132 may include various electrical connections. In certain examples, the electrical protrusions 130 and electrical receptacles 132 include multiple pin connectors. In examples where computing components (e.g., the processor 110, memory 112, or battery 114) are on separate components (e.g., first component 102 and second component 104), maintaining electrical communication between the first component 102 and the second component 104 may be important. For example, if a computing component on the second component 104 were to lose electrical communication with an electrical component on the first component 102, the computing device 100 may fail (e.g., an operating system may crash or a computing component may be affected by a power surge when the electrical connection is restored). Some electrical connections may be sensitive (e.g., high speed). Thus, in some examples, it may be desirable for the first component 102 and the second component 104 to be securely connected in the docked configuration by a locking mechanism 120. Furthermore, in some examples, it may be desirable for a computing component (e.g., the processor 112, memory 113, or battery 114) in the second component 104 to hand off its responsibilities to a computing component (e.g., the processor 112, memory 113, or battery 114) on the first component 102 (or vice versa) before undocking from the first component 102.

In addition to the locking mechanism 120 provided between the two electronic devices 102, 104, the hybrid electronic device 100 may include a lock component 140 of the first electronic device 102 or a lock component 142 of the second electronic device 104. The lock component 140, 142 is configured to connect with an external lock to secure the first or second electronic device, respectively. The lock component 140, 142 of the first or second electronic device 102, 104 may be a receptacle or opening within the housing or a protrusion extending from a surface of the housing of the electronic device.

For example, a lock component 140 (e.g., including a receptacle or slot) may be positioned within a surface 144 of the housing 116 of the first electronic device 102. The lock component 140 of the first electronic device 102 may be positioned within a different surface of the housing 116 as the surface having the receptacles 122, 132. Alternatively, the lock component may be positioned within a same surface of the housing 116 as the receptacles 122, 132.

Alternatively, or additionally, a lock component 142 (e.g., including a receptacle or slot) may be positioned within a surface 146 of the housing 118 of the second electronic device 104. The lock component 142 of the second electronic device 104 may be positioned within a different surface of the housing 118 including the protrusions 124, 130. Alternatively, the lock component may be positioned within a same surface as the protrusions 124, 130 of the housing 118.

The first or the second electronic device 102, 104 of the hybrid electronic device 100 is configured to connect with an external locking device at the lock component 140, 142.

The locking device may be any type of locking device now known or later developed which may be inserted into an opening of the housing of the electronic device or attached to a protrusion extending from the housing of the electronic device. In one example, the locking device includes a lock attached at an end of a security cable or tether. In other examples, the locking device may include a docking station, which itself may be locked or otherwise secured.

In one example, the lock is a Kensington lock. The lock includes a cylindrical lock barrel with a key hole in one end and a T-shaped lock pin extending from the opposite end. The T-shaped lock pin may include a cylindrical shaft that protrudes from the lock barrel, and a cylindrical cross-member formed or attached perpendicularly to the shaft. A pair of pegs jut outwardly from the lock barrel parallel and adjacent to the shaft of the T-shaped lock pin. The pegs remain stationary during locking. The Kensington lock may be attached to the lock component having an elongated aperture sized and shaped to accept the cross-member of the T-shaped lock pin. Once the pin is inserted into the aperture, turning the key rotates the T-shaped lock pin approximately 90° within the barrel and relative to the stationary pegs. This action rotates the cross-member of the T-shaped lock pin perpendicular to the elongated aperture, thereby securing the Kensington lock to the receptacle.

Figure 3:
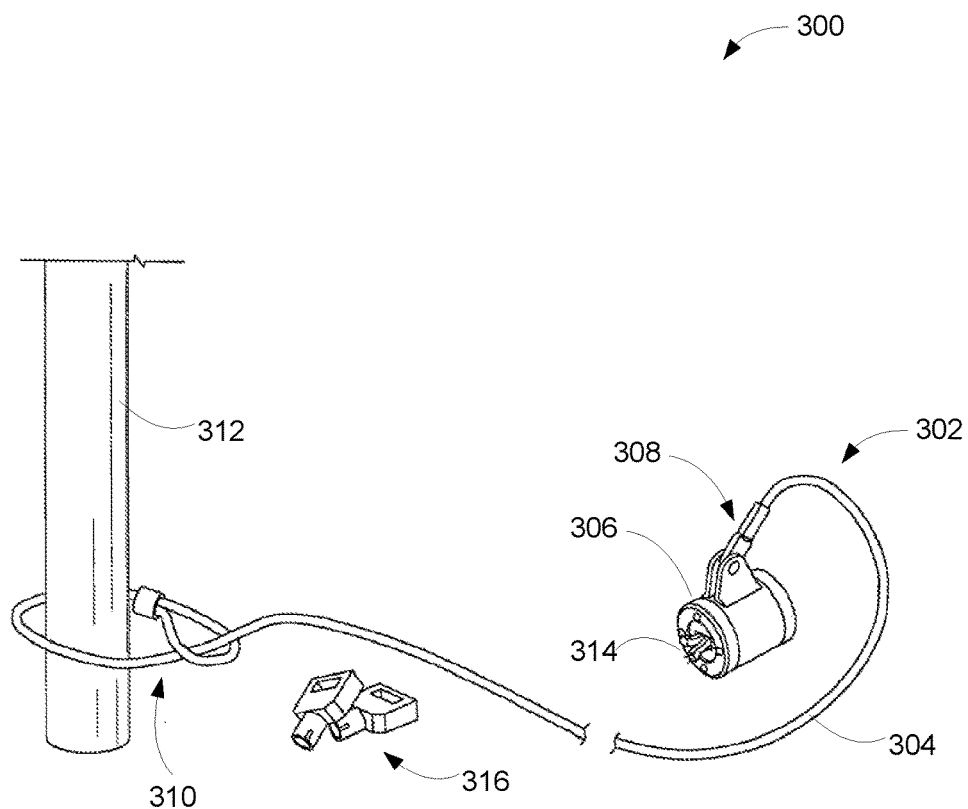
FIG. 3 depicts an example of a locking device for locking a component of the hybrid device of FIG. 1 or 2.

FIG. 3 depicts an example 300 of a locking device 302. The locking device 302 includes a security cable 304 and a lock 306 attached at one end 308 of the security cable 304. A portion of the security cable at a second, opposite end 310 of the cable 304 is configured to be wrapped around an immobile object 312 (e.g., a leg of a table) to prevent theft of an attached/locked electronic device.

A portion of the lock 306 is configured to be inserted into an opening of a housing of an electronic device (e.g., the opening of the lock component 140 in the housing 116 of the first electronic device 102 or the opening of the lock component 142 in the housing 118 of the second electronic device 104). The lock 306 may include a latch mechanism 314 to secure the lock 306 within the opening of the lock component 140, 142. The latch mechanism 314 may be actuated manually by a user (e.g., by turning a key 316 to move the latch mechanism 314 between locked and unlocked positions).

When the locking device 302 is connected to a first component of the hybrid electronic device, the hybrid electronic device is configured to prevent one or more additional connected components from being detached. For example, when the locking device 302 is connected to the lock component 140 of the first electronic device 102, the first electronic device 102 may be configured to prevent the second electronic device 104 from being detached. Alternatively, when the locking device 302 is connected to the lock component 140 of the first electronic device 102, the second electronic device 104 may be configured to prevent the first electronic device 102 from being detached.

In another example, when the locking device 302 is connected to the lock component 142 of the second electronic device 104, the second electronic device 104 may be configured to prevent the first electronic device 102 from being detached. Alternatively, when the locking device 302 is connected to the lock component 142 of the second electronic device 104, the first electronic device 102 may be configured to prevent the second electronic device 104 from being detached.

There are several methods or mechanisms for preventing detachment of the connected electronic devices of the hybrid electronic device when the locking device is attached or locked to one of the devices. In some examples, a computer program stored within a memory of one component of the hybrid electronic device may be used to assist in determining when a locking device is attached and what signals or instructions are sent between different components or modules within the hybrid electronic device.

In one mechanism, a detection device (e.g., a sensor) is positioned within the opening or receptacle of the lock component of the electronic device. In an alternative example, the sensor is positioned on a surface of a protrusion of the lock component of the electronic device.

The detection device or sensor is configured to identify or determine when an external locking device (e.g., a Kensington lock) is connected and/or within a locked position at the lock component. The sensor relays this information regarding the connection status of the locking device and electronic device (e.g., connected, locked, disconnected, unlocked) to a processor or power control module. The processor or power control module may be positioned within the electronic device (or, in certain examples, the attached additional electronic device). The processor or power control module may then relay a signal to a power supply (present within the electronic device or attached electronic device) to cut off power to the locking mechanism (e.g., an additional lock component) connecting the two electronic devices. The lack of power at the locking mechanism may prevent the two electronic devices from being detached from each other.

In a second mechanism of identifying and preventing detachment of the two electronic devices from one another, one electronic device may include a switch. The switch may be positioned within the housing of the electronic device. In one example, the switch may be positioned in an opening or receptacle of the lock component of the electronic device. In an alternative example, the switch is positioned on a surface of a protrusion of the lock component of the electronic device.

The switch is configured to move between a first position and a second position based on whether the external locking device is connected and/or within a locked position at the lock component. The switch may operate to provide an electrical current or power to a lock component of the locking mechanism between the two electronic devices based upon whether the switch is in the first position or the second position. In other words, the switch is configured to move between a connected mode (wherein power is provided to the additional lock component/locking mechanism between the two devices) and a cut-off mode (wherein power is cut-off from the additional lock component or locking mechanism between attached devices). The lack of an electrical current or power at the additional lock component or locking mechanism may prevent the two electronic devices from being detached from each other.

The switch is configured to be in the first position (i.e., connected mode) when no lock is attached to or locked at the lock component. The switch is configured to move into the second position (i.e., the cut-off mode) when a lock is attached to or locked at the lock component.

The switch may be physically moved into the cut-off mode by the attached lock. In other words, the switch may be positioned within the opening/receptacle of the lock component such that the switch will move into a second position (cut-off mode) by the lock as it is inserted into the opening (or when a latch mechanism of the lock is activated within the opening to secure the lock. In other examples, the switch may be programmed to move between the first and second positions based upon a signal received from a processor within the electronic device or additional electronic device.

In a third mechanism of identifying and preventing detachment of the two electronic devices from one another, the electronic device may include a circuit configured to provide power from the power supply to the additional lock component or locking mechanism between the attached devices. The circuit is configured to be interrupted when the locking device is connected at the lock component. In other words, the circuit is configured to move between a connected mode (wherein power is provided to the additional lock component or locking mechanism between the two devices) and a cut-off mode (wherein power is cut-off from the additional lock component or locking mechanism). The lack of power at the additional lock component or locking mechanism may prevent the two electronic devices from being detached from each other.

The circuit may be positioned within the opening/receptacle of the lock component (or on a surface of a protrusion of a lock component) such that the circuit will be cut off by the lock as the lock is attached or moved into a lock position (e.g., by a latch mechanism). In another example, the circuit may be positioned adjacent to the receptacle of the lock component (and not within the receptacle). The circuit's position is configured such that the circuit will be cut off by an intermediate component of the electronic device between the lock and the circuit as the lock is attached or moved into a lock position (e.g., by a latch mechanism).

In a fourth mechanism, the electronic device may include a mechanical lock positioned within a housing of the electronic device. The mechanical lock is configured to move between a first, unlock position and a second, lock position.

The mechanical lock is configured to move when an external lock is attached to, inserted into, or moved into a lock position (e.g., by a latch mechanism of the lock). A portion of the mechanical lock is positioned within the opening of the lock component or on a surface of a protrusion of the lock component. When the lock is attached to, inserted into, or moved into the lock position at the lock component, the lock physically contacts the portion of the mechanical lock, and moves the mechanical lock. This movement causes a second portion of mechanical lock to lock the attached, additional electronic device.

In other words, the mechanical lock within the electronic device is configured to contact both the additional electronic device and the external lock when the external lock is attached/connected/locked.

Figure 4:
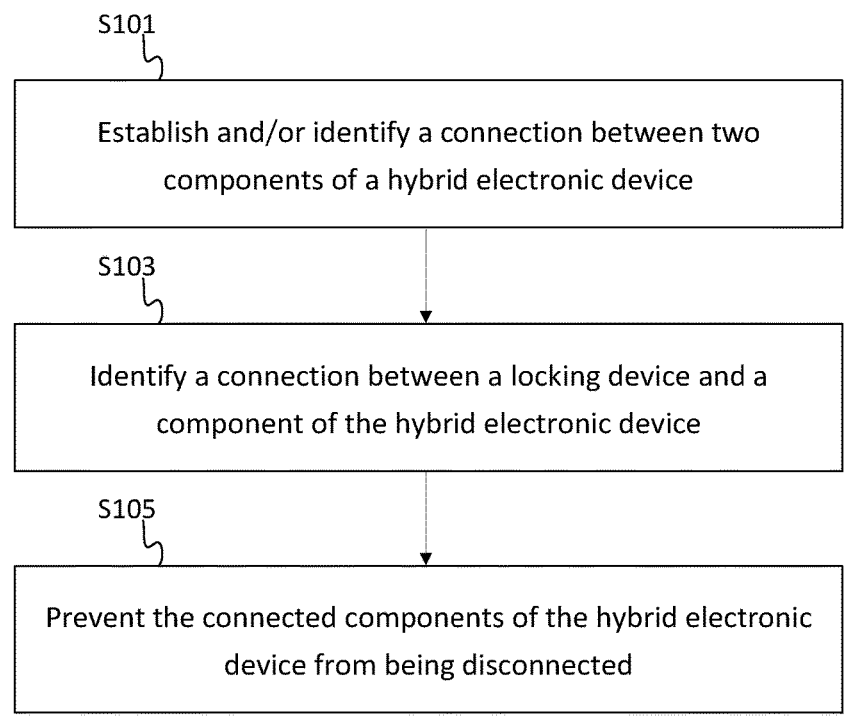
FIG. 4 illustrates an example flowchart of a process for preventing at least two devices or components of a hybrid electronic device from being separated from each other.

FIG. 4 illustrates an example flowchart of a process for preventing at least two devices or components of a hybrid electronic device from being separated from each other. The process may be performed by a hybrid electronic device having a first component or device and a second component. Certain acts may be performed using a processor positioned within a housing of the first or the second component. Alternatively, another processor or device may be configured to perform one or more of the following acts. Additional, fewer, or different acts may be included.

At act S101, a connection is established and/or identified between a first and a second electronic device. One example of establishing a connection between the first and second devices is depicted in FIG. 2. The lock components (e.g., protrusions) of one electronic device may be inserted into the lock components (e.g., receptacles) of a second electronic device (see, e.g., elements 122 and 124 in FIG. 2). One or more mechanisms may be used to identify that the two devices are connected to each other. For example, as described above, a sensor, switch, or circuit may be positioned within a receptacle of a lock component (or within a separate location of an electronic device) for identifying the connection. A processor within the same electronic device, or the connected electronic device, may receive a signal from the sensor, switch, or circuit to identify that the two components are connected. A computer program stored within a memory of the hybrid electronic device may be used to define when a connection is present based upon the type of signal transmitted to and received by the processor.

At act S103, a connection is identified between a component of the hybrid electronic device and a locking device. As noted above, non-limiting examples of locking devices include a Kensington lock or a docking station. The locking device may be connected to a lock component positioned within an opening or aperture of a housing of an electronic device or component of the hybrid electronic device. Alternatively, the locking device may be connected to a lock component protruding from a surface of the housing of the electronic device. As noted above, one or more mechanisms may be used to identify that the locking device is attached and/or locked to the lock component are connected to each other. For instance, a sensor, switch, or circuit may be positioned on a surface of or within the opening of the lock component of the electronic device to identify the connection. A processor within the same electronic device, or the connected electronic device, may receive a signal from the sensor, switch, or circuit to identify that the locking device is attached to the lock component. A computer program stored within a memory of the hybrid electronic device may be used to define when a connection is present based upon the type of signal transmitted to and received by the processor.

At act S105, the hybrid electronic device is configured to prevent the two connected devices from being physically separated from each other based on the identified connections. In one example, mechanical components within one electronic device are configured to physically lock the second electronic device while the locking device is attached. In another example, the hybrid electronic device is programmed to cut off power to the connection (e.g., locking mechanism) between the first and second electronic devices while the locking device is attached. A processor within one electronic device may transmit a signal to a power supply unit of the same electronic device, or the second connected electronic device, to cut off power to the locking mechanism connecting the two devices. Without power, the two devices may not be disconnected from each other. A computer program stored within a memory of the hybrid electronic device may be used to define the type of instruction or signal transmitted to the power supply unit to toggle power on/off at the locking mechanism.

Figure 5:
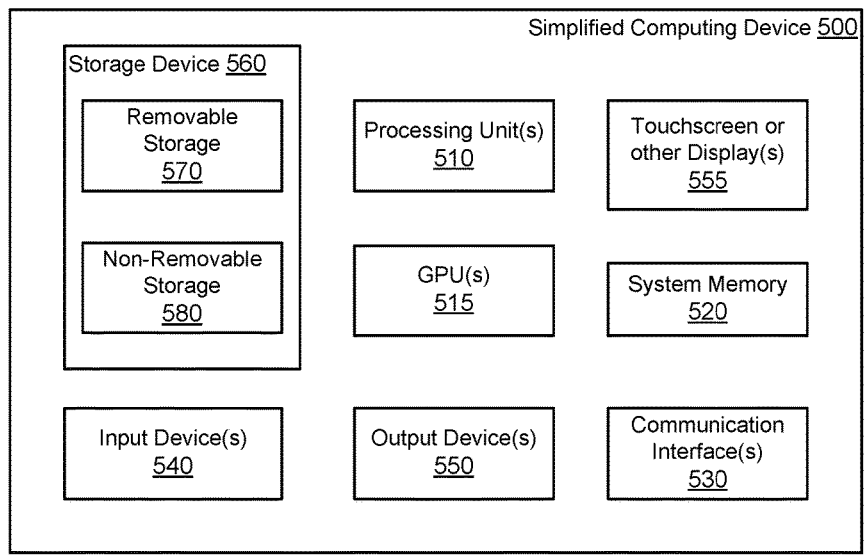
FIG. 5 is a block diagram of a computing environment in accordance with one example of a hybrid electronic device or a component of a hybrid electronic device described herein.

Regarding FIG. 5, the devices described above may be incorporated within an exemplary computing environment 500. The computing environment 500 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. In certain examples, the computing device may be a wearable electronic device, wherein the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

The computing environment 500 has sufficient computational capability and system memory to enable basic computational operations. In this example, the computing environment 500 includes one or more processing unit(s) 510, which may be individually or collectively referred to herein as a processor. The computing environment 500 may also include one or more graphics processing units (GPUs) 515. The processor 510 and/or the GPU 515 may include integrated memory and/or be in communication with system memory 520. The processor 510 and/or the GPU 515 may be a specialized microprocessor, such as a digital signal processor (DSP), a very long instruction word (VLIVV) processor, or other microcontroller, or may be a general-purpose central processing unit (CPU) having one or more processing cores. The processor 510, the GPU 515, the system memory 520, and/or any other components of the computing environment 500 may be packaged or otherwise integrated as a system on a chip (SoC), application-specific integrated circuit (ASIC), or other integrated circuit or system.

The computing environment 500 may also include other components, such as, for example, a communications interface 530. One or more computer input devices 540 (e.g., pointing devices, keyboards, audio input devices, video input devices, haptic input devices, or devices for receiving wired or wireless data transmissions) may be provided. The input devices 540 may include one or more touch-sensitive surfaces, such as track pads. Various output devices 550, including touchscreen or touch-sensitive display(s) 555, may also be provided. The output devices 550 may include a variety of different audio output devices, video output devices, and/or devices for transmitting wired or wireless data transmissions.

The computing environment 500 may also include a variety of computer readable media for storage of information such as computer-readable or computer-executable instructions, data structures, program modules, or other data. Computer readable media may be any available media accessible via storage devices 560 and includes both volatile and nonvolatile media, whether in removable storage 570 and/or non-removable storage 580. Computer readable media may include computer storage media and communication media. Computer storage media may include volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium, which may be used to store the desired information and which may be accessed by the processing units of the computing environment 500.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

Claim Support Section

In a first embodiment, an electronic device comprises a housing; a first lock component attached to the housing or positioned in an opening of the housing; and a second lock component attached to the housing or positioned in an opening of the housing, wherein the electronic device is configured to connect with a locking device at the first lock component, wherein the electronic device is configured to connect with an additional electronic device at the second lock component, and wherein, when the locking device is connected at the first lock component, the electronic device is configured to prevent the additional electronic device from being detached at the second lock component.

In a second embodiment, with reference to the first embodiment, the electronic device is a tablet computer, a display device, an input device, or a smart phone.

In a third embodiment, with reference to the first or second embodiment, the electronic device further comprises a sensor configured to determine when the locking device is connected at the first lock component; a power supply; and a processor configured to cut off power from the power supply to the second lock component when the sensor has determined that the locking device is connected, thereby preventing the additional electronic device from being detached from the electronic device.

In a fourth embodiment, with reference to the first or second embodiment, the electronic device further comprises a power supply; and a switch configured to move between a connected mode and a cut-off mode, wherein power from the power supply is provided to the second lock component in the connected mode and cut-off to the second lock component in the cut-off mode, and wherein the switch is configured to move to the cut-off mode when the locking device is connected at the first lock component, thereby preventing the additional electronic device from being detached from the electronic device.

In a fifth embodiment, with reference to the first or second embodiment, the electronic device further comprises a power supply; and a circuit configured to provide power from the power supply to the second lock component, wherein the circuit is interrupted when the locking device is connected at the first lock component, thereby preventing the additional electronic device from being detached from the electronic device.

In a sixth embodiment, with reference to the first or second embodiment, the electronic device further comprises a mechanical lock configured to move between an unlock position and a lock position, wherein the mechanical lock is configured to move into the lock position when the locking device is connected at the first lock component, and wherein the mechanical lock is configured to prevent the additional electronic device from being detached from the electronic device when in the lock position.

In a seventh embodiment, with reference to any of embodiments 1-6, the locking device comprises a Kensington lock.

In an eighth embodiment, with reference to any of embodiments 1-7, the locking device comprises a docking station.

In a ninth embodiment, with reference to any of embodiments 1-8, the first lock component is positioned in an opening of a first surface of the housing, and the second lock component is attached to a second surface of the housing or positioned in an opening of the second surface of the housing.

In a tenth embodiment, a hybrid electronic device comprises a first electronic device having a housing and a lock component attached to the housing or positioned in an opening of the housing; and a second electronic device that is detachable from the first electronic device, wherein the first electronic device is configured to connect with a locking device at the lock component, and wherein, when the locking device is connected to the lock component, the hybrid electronic device is configured to prevent the first electronic device and the second electronic device from being detached from each other.

In an eleventh embodiment, with reference to the tenth embodiment, the first electronic device comprises an input device, and the second electronic device is a tablet computer.

In a twelfth embodiment, with reference to the tenth embodiment, the first electronic device is a tablet computer, and the second electronic device comprises an input device.

In a thirteenth embodiment, with reference to any of embodiments 10-12, the first electronic device comprises a sensor, a power supply, and a processor positioned within the housing of the first electronic device, wherein the sensor is configured to determine when the locking device is connected at the lock component, and wherein the processor is configured to cut off power from the power supply to a connection between the first electronic device and the second electronic device when the sensor has determined that the locking device is connected, thereby preventing the second electronic device from being detached from the first electronic device.

In a fourteenth embodiment, with reference to any of embodiments 10-12, the first electronic device comprises power supply and a switch positioned within the housing of the first electronic device, wherein the switch is configured to move between a connected mode and a cut-off mode, wherein power from the power supply is provided to a connection between the first electronic device and the second electronic device in the connected mode and cut-off to the connection in the cut-off mode, and wherein the switch is configured to move to the cut-off mode when the locking device is connected at the lock component, thereby preventing the second electronic device from being detached from the first electronic device.

In a fifteenth embodiment, with reference to any of embodiments 10-12, the first electronic device comprises power supply and a circuit positioned within the housing of the first electronic device, wherein the circuit is configured to provide power from the power supply to a connection between the first electronic device and the second electronic device, and wherein the circuit is interrupted when the locking device is connected at the lock component, thereby preventing the second electronic device from being detached from the first electronic device.

In a sixteenth embodiment, a hybrid electronic device comprises a first electronic device having a lock component; a second electronic device that is detachable from the first electronic device; at least one processor; and at least one memory including computer program code for one or more programs; the at least one memory and the computer program code configured to, with the at least one processor, cause the hybrid electronic device to at least perform: (1) identify a connection between the first electronic device and the second electronic device; (2) identify a locking device attached at the lock component of the first electronic device; and (3) prevent the second electronic device from being detached from the first electronic device.

In a seventeenth embodiment, with reference to the sixteenth embodiment, the at least one processor is positioned within a housing of the first electronic device.

In an eighteenth embodiment, with reference to the sixteenth embodiment, the at least one processor is positioned within a housing of the second electronic device.

In a nineteenth embodiment, with reference to any of embodiments 16-18, the hybrid electronic device further comprises a sensor; and a power supply, wherein the sensor is configured to identify when the locking device is attached at the lock component, and wherein the at least one processor is configured to cut off power from the power supply to the connection between the first electronic device and the second electronic device when the sensor has determined that the locking device is attached, thereby preventing the second electronic device from being detached from the first electronic device.

In a twentieth embodiment, with reference to any of embodiments 16-18, the hybrid electronic device further comprises a power supply; and a switch, wherein the first electronic device comprises power supply and a switch positioned within a housing of the first electronic device, wherein the switch is configured to move between a connected mode and a cut-off mode, wherein power from the power supply is provided to the connection between the first electronic device and the second electronic device in the connected mode and cut-off to the connection in the cut-off mode, and wherein the switch is configured to move to the cut-off mode when the locking device is attached at the lock component, thereby preventing the second electronic device from being detached from the first electronic device.

What is claimed is:

1. An electronic device comprising:
   a housing;
   a first lock component attached to the housing or positioned in an opening of the housing;
   a second lock component attached to the housing or positioned in an opening of the housing;
   a power supply; and
   a switch configured to move between a connected mode and a cut-off mode,
   wherein the electronic device is configured to connect with a locking device at the first lock component,
   wherein the electronic device is configured to connect with an additional electronic device at the second lock component,
   wherein power from the power supply is provided to the second lock component in the connected mode and cut-off to the second lock component in the cut-off mode, and
   wherein, when the locking device is connected at the first lock component,
   the switch is configured to move to the cut-off mode, thereby preventing the additional electronic device from being detached from the electronic device.

2. The electronic device of claim 1, wherein the electronic device is a tablet computer, a display device, an input device, or a smart phone.

3. The electronic device of claim 1, wherein the locking device comprises a Kensington lock.

4. The electronic device of claim 1, wherein the locking device comprises a docking station.

5. The electronic device of claim 1, wherein the first lock component is positioned in an opening of a first surface of the housing, and the second lock component is attached to a second surface of the housing or positioned in an opening of the second surface of the housing.

6. A hybrid electronic device comprising:
   a first electronic device having a housing, a lock component attached to the housing or positioned in an opening of the housing, a power supply positioned within the housing, and a circuit positioned within the housing; and
   a second electronic device that is detachable from the first electronic device,
   wherein the first electronic device is configured to connect with a locking device at the lock component,
   wherein the circuit is configured to provide power from the power supply to a connection between the first electronic device and the second electronic device,
   wherein, when the locking device is connected to the lock component, the hybrid electronic device is configured to prevent the first electronic device and the second electronic device from being detached from each other, and
   wherein the circuit is interrupted when the locking device is connected at the lock component, thereby preventing the second electronic device from being detached from the first electronic device.

7. The hybrid electronic device of claim 6, wherein the first electronic device comprises an input device, and
   wherein the second electronic device is a tablet computer.

8. The hybrid electronic device of claim 6, wherein the first electronic device is a tablet computer, and
   wherein the second electronic device comprises an input device.

9. A hybrid electronic device comprising:
   a first electronic device having a lock component;
   a second electronic device that is detachable from the first electronic device;
   a sensor configured to identify when a locking device is attached at the lock component of the first electronic device;
   a power supply;
   at least one processor; and
   at least one memory including computer program code for one or more programs, the at least one memory and the computer program code configured to, with the at least one processor, cause the hybrid electronic device to at least perform:
     identify a connection between the first electronic device and the second electronic device;
     identify the locking device attached at the lock component of the first electronic device; and
     prevent the second electronic device from being detached from the first electronic device by cutting off power from the power supply to the connection between the first electronic device and the second electronic device when the sensor has determined that the locking device is attached, thereby preventing the second electronic device from being detached from the first electronic device.

10. The hybrid electronic device of claim 9, wherein the at least one processor is positioned within a housing of the first electronic device.

11. The hybrid electronic device of claim 9, wherein the at least one processor is positioned within a housing of the second electronic device.

* * * * *